(12) United States Patent
Hinz

(10) Patent No.: US 8,904,083 B2
(45) Date of Patent: Dec. 2, 2014

(54) METHOD AND APPARATUS FOR STORING DATA IN SOLID STATE MEMORY

(75) Inventor: Torsten Hinz, Augsburg (DE)

(73) Assignee: Infineon Technologies AG, Neubiberg (DE)

( * ) Notice: Subject to any disclaimer, the term of this patent is extended or adjusted under 35 U.S.C. 154(b) by 1133 days.

(21) Appl. No.: 12/182,826

(22) Filed: Jul. 30, 2008

(65) Prior Publication Data

US 2010/0030944 A1 Feb. 4, 2010

(51) Int. Cl.
*G06F 12/00* (2006.01)
*G11C 7/22* (2006.01)
*G06F 13/00* (2006.01)
*G06F 13/28* (2006.01)
*G06F 12/08* (2006.01)
*G11C 16/32* (2006.01)

(52) U.S. Cl.
CPC .............. *G11C 7/22* (2013.01); *G06F 12/0864* (2013.01); *G11C 2207/2236* (2013.01); *G06F 12/0866* (2013.01); *G06F 2212/2022* (2013.01); *G06F 2212/7208* (2013.01); *G11C 2207/2245* (2013.01); *G11C 16/32* (2013.01)
USPC ............ 711/103; 711/113; 711/118; 711/150

(58) Field of Classification Search
CPC .................. G06F 2212/2022; G06F 12/0864; G06F 12/0866; G11C 16/32; G11C 2207/2245; G11C 2207/2236; G11C 7/22
USPC .................................. 711/103, 113, 118, 150
See application file for complete search history.

(56) References Cited

U.S. PATENT DOCUMENTS

| | | | |
|---|---|---|---|
| 6,202,138 B1 * | 3/2001 | Estakhri et al. ................ | 711/168 |
| 6,275,436 B1 * | 8/2001 | Tobita et al. .................... | 365/221 |
| 6,286,091 B1 * | 9/2001 | Park .............................. | 711/207 |
| 6,493,250 B2 * | 12/2002 | Halbert et al. .................. | 365/63 |
| 2003/0061445 A1 * | 3/2003 | Birk et al. ...................... | 711/118 |
| 2004/0172496 A1 * | 9/2004 | Schoepflin et al. .............. | 711/5 |
| 2004/0205290 A1 * | 10/2004 | Shinagawa et al. ............. | 711/103 |
| 2005/0144361 A1 * | 6/2005 | Gonzalez et al. ............. | 711/103 |
| 2007/0106836 A1 * | 5/2007 | Lee et al. ....................... | 711/103 |
| 2008/0279012 A1 * | 11/2008 | Lee ........................... | 365/185.19 |
| 2009/0059695 A1 * | 3/2009 | Kim et al. ...................... | 365/200 |

* cited by examiner

*Primary Examiner* — Yong Choe
*Assistant Examiner* — Mark Giardino, Jr.
(74) *Attorney, Agent, or Firm* — Slater & Matsil, L.L.P.

(57) ABSTRACT

A method and a storage device for storing data in a flash memory drive are disclosed. In order to increase data throughput, the drive includes a cache memory including a tag memory and a plurality of flash devices coupled via a plurality of channels to the cache memory.

21 Claims, 3 Drawing Sheets

METHOD AND APPARATUS FOR STORING DATA IN SOLID STATE MEMORY

TECHNICAL FIELD

The invention relates to the field of storing data in solid state memory. In particular embodiments a solid state drive and a corresponding method for storing data therein are described.

BACKGROUND

Solid state disks, also known as solid state drives (SSD), and storage media such as USB memory sticks or flash cards, e.g., CF (compact flash) or SD (secure digital), are storage media capable of storing mass amounts of data. The drives, for example, can be used for storing data in computers or any other digital signal processing device similar to conventional hard disk drives. Unlike conventional hard disk drives, which employ a mechanically rotating disk having a magnetic coating, the solid state drives do not employ any mechanically moved parts. Instead solid state drives comprise integrated circuits for storing the data, wherein the integrated circuits comprise arrays of memory cells.

Several types of non-volatile memory cells are known. In one example, memory cells basically are made from double-gate transistors, which have two gates instead of one. A first gate is the control gate for controlling the transistor as known from conventional transistors. A floating gate is arranged between the control gate an the MOSFET channel area. The floating gate is surrounded by an insulating material. Any charge carriers, i.e., electrons, placed on the floating gate are thus trapped and will not be discharged under normal operating conditions. The memory cells accordingly maintain their status even if power is turned off, the memory thus being non-volatile.

Charge carriers, for example, can be placed on the floating gate by applying a high voltage to the control gate thus switching the transistor on and enabling a strong current from source to drain. The strong currents affect some electrons to jump onto the floating gate via a process called hot-electron injection. For removing the electrons a high voltage of opposite polarity is applied between control gate and drain for pulling off the electrons by so-called quantum-tunneling. This process of hot-electron injection and quantum tunneling, in particular, is used in NOR memory cells. Alternatively and, in particular, in NAND memory cells a process called tunnel injection can be used to inject electrons on the floating gate, i.e., for writing, and a process called tunnel release for removing the electrons from the floating gate, i.e., for erasing memory cells.

The memory cells can be connected, for example, in NOR or NAND architecture. In NOR architecture the memory cells are switched in parallel. Memory cells can be accessed individually. NAND memory cells are connected in series such that a plurality of memory cells shares one data line. The cells thus can be accessed in series only, such that for reading and writing the cells are accessed successively. Due to this architecture memory cells cannot be accessed individually. So for reading and programming, i.e., writing, all cells of a page are accessed.

In the here described example the transistor is the memory element storing the information. Note that memory cells comprising other memory elements can be used as well, for example memory cells comprising volumes of phase change material, i.e., PCRAM, or comprising other resistively switching materials, for example, magneto resistive RAM (MRAM).

In single state memory cells a cell is sensed to reflect one bit, i.e., the transistor is either conducting or non-conducting. In multi-state memory cells one cell may take more than two states. When the state of the memory cell is sensed, the amount of current passing through the transistor is sensed. A cell may accordingly take one of a plurality of resistivity levels and thus may reflect more than one bit, such that the cell is multi-level cell.

Unlike conventional storage devices comprising magnetic disks for storing data the above described flash memory in NAND architecture exhibits different characteristics regarding reading, programming and erasing data. Accordingly the principles developed for conventional storage media cannot be applied to this type of flash memory. Hence there is a need to develop fast and reliable flash memory devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The present invention will now be described with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances well known processes and steps have not been described in detail in order not to unnecessarily obscure the present invention.

Although the invention may be applied to other memory devices the following description, in particular, relates to memory in NAND architecture, in which memory cells can be accessed in groups only.

Figure 1:
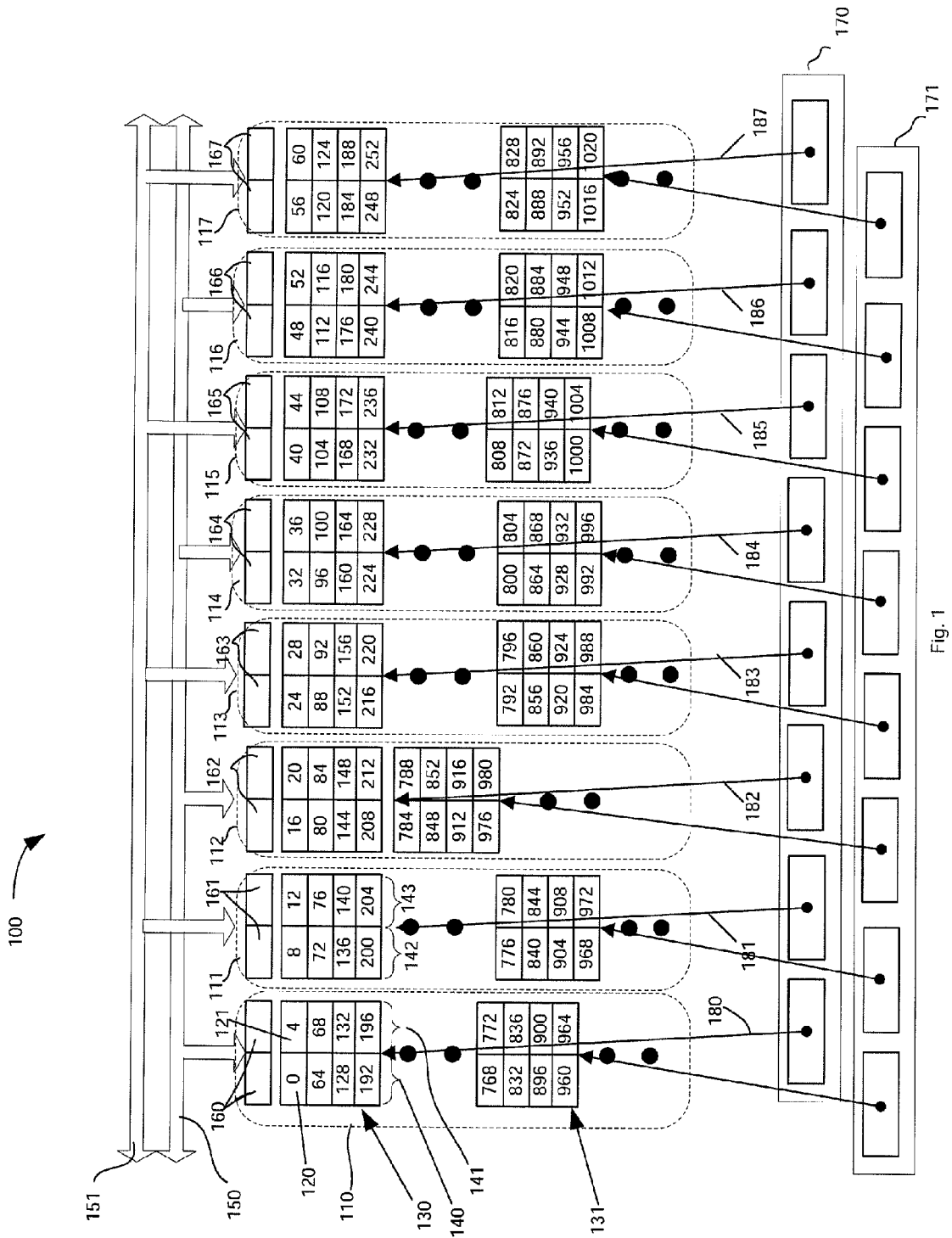
FIG. 1 depicts a schematic memory arrangement according to one embodiment.

FIG. 1 schematically depicts a schematic arrangement of a flash memory storage drive 100 according to one embodiment.

Flash memory drive 100 may comprise a plurality of flash devices 110 to 117, wherein a flash device is characterized in that it is adapted and configured to perform only one operation at a time, i.e., the flash device may either read data from flash memory cells into a device internal page buffer or receives data from a channel or programs the contents of the page buffer to a flash memory page or deletes flash memory pages. In this way a flash device can be considered as a unit capable of processing a data chunk autonomously once triggered by a suitable command. Actually flash devices are controlled by commands sent by a controller to perform one of these operations. Physically a plurality of flash devices can be realized on one silicon die or one flash device can be distributed across one or more silicon dice.

The flash memory cells within each flash device are grouped to flash memory pages 120, 121, wherein the flash memory pages are of equal size. In this embodiment the size of a flash memory page is 2 kB plus additional storage for storing meta data such as error correction code (ECC) values.

With regard to today's organization of data storage a page in this way comprises four sectors each of 512 bytes size. The numbers drawn within the depicted flash memory pages denote the start sector number of a flash memory page within the flash memory device 100 starting from 0. Accordingly the 0 denoted in flash memory page 120 denotes the starting address of a first page of flash memory, the second flash memory page comprises sectors 4-7, the sector address of the second flash memory page thus starting at 4 etc.

A plurality of flash memory pages 120, 121 in one flash device is grouped to a memory management block 130, wherein the pages of a memory management block 130 are arranged in two planes 140, 141 being the left and right column of schematically depicted management block 130. Memory management block 130 in this embodiment comprises eight flash memory pages arranged in two planes, wherein flash memory pages starting with sectors 0, 64, 128, 192 are arranged in plane 140 and flash memory pages starting with sectors 4, 68, 132 and 196 are arranged in plane 141. Each of the flash devices 110 to 117 in this way comprises a plurality of memory management blocks each comprising a plurality of flash memory pages arranged in two planes. Flash memory pages in the two planes of one memory management block can be operated at the same time, such that for example a page in plane 140 can be read or programmed parallel, i.e., at the same time, when a page of plane 141 is programmed.

For receiving data from and transmitting data to a host each flash device is coupled to a channel, wherein in this embodiment flash devices 110, 112, 114 and 116 are operatively coupled to channel 150 and flash devices 111, 113, 115 and 117 are coupled to channel 151 respectively. In this way one channel is coupled to at least two flash devices.

A channel may be busy with only one of its coupled flash devices at a time. Accordingly in situations when a channel is coupled to more than one flash device and data are ready to be transmitted to or received from more than one flash device the transmit operations cannot be performed at the same time but only sequentially one after another. However once the data is transmitted to a particular flash device that device may be controlled to perform further operations autonomously, such that the further operation, i.e., the processing of the data, does not affect the channel.

Each flash device furthermore comprises a page buffer 160, 161 for buffering data. So when reading data from a flash memory page the data is buffered in the page buffer before being transmitted over the channel. Similarly when data is signalled to a flash device for storing the data in flash memory the data is buffered in the page buffer before the data is programmed, i.e., written, to a flash memory page. The page buffer of each flash device has the storage size of two flash memory pages including their meta data, such that the contents of two pages can be buffered in the page buffer of each flash device. Flash memory pages in a flash device in this way are not accessed directly via the channel, but data to be read from or to be written to flash memory pages of a flash device are buffered in the page buffer.

The page buffer can be operated faster than the pages of flash memory and may be volatile, i.e., the buffer may not store the data without a power supply, as the buffer serves as an intermediate buffer. Accordingly the page buffer may not be of flash memory but can be of a different type, for example, such as conventional DRAM or SDRAM.

For addressing a page in a management block a logical block address (LBA) is stored in a translation table 170 that maps a received logical block address to the actual, physical address of the page. Accordingly structures 170, 171 hold addresses 180-187 each pointing at one management block of a different flash device.

Due to the NAND architecture of the flash devices memory cells, fractions of a page cannot be accessed individually, only a page as a whole can be accessed for writing or reading. So for reading a fraction of a page the entire page must be read and only the requested fraction is forwarded to a requesting host. Similarly when a sector of a flash memory page shall be updated the entire page must be written.

Furthermore flash memory cells can be programmed only once. That is, starting from an initial state, in which all memory cells of a page have an initial state of, for example, logical 1, a cell can be programmed, i.e., written, to a logical state of 0 only once. In order to reset a cell to logical 1 it has to be erased, wherein the cell cannot be erased individually but in an erase block only. Generally an erase block may comprise any number of flash memory pages within one flash device. In particular an erase block comprises flash memory pages of some memory management blocks, such that an erase block has the storage size of some of these blocks.

Another characteristic is that pages of an erase block must be written sequentially. That is, flash memory pages cannot be written randomly within an erase block, but in sequential order only.

Accordingly for random writes, i.e., for updating some but not all of the memory cells of a sector in a page, the new data must be merged with the data to be maintained. Note that usually sectors are the smallest data unit transmitted to a storage device from a host. That is for switching at least one bit stored in a sector of a page the sector containing the at least one bit is transferred to the memory. The contents of a page to be maintained unmodified accordingly is read from the page, i.e., three of the four sectors of the concerned page, and stored in another page, wherein the transferred sector replaces one sector within the page. The corresponding record in the address translation table is updated correspondingly such that the logical address maps to the newly written flash memory page. Oftentimes a so-called log block is used for storing sectors comprising amendments, such that only the amended sector is stored in the log block and the mapping of the LBA of the original sector is redirected to the corresponding sector in the log block.

However storing sectors in the log block necessarily comes to an end when all sectors in the log block are filled. If so then the memory controller or memory management unit (MMU) needs to free an entire erase block. Before an erase block can be reset the contents of the block must be saved. That is the controller copies the data of the sectors in the log block together with the remaining data of the original page mapping to another location in the memory and accordingly modifies the address table. After the data of all sectors in the erase block of the log block have been merged with the original data the erase block can be erased.

Reading of a flash memory page takes about 25 µs, the programming of a page, i.e., the writing of a page, takes about 200 µs and erasing an erase block takes about 1.5 ms. These durations may add, for example, when erasing an erase block.

For storing a file in the flash memory drive the data, for example, is signalled from a host to the drive. Assuming that the data to be stored exceeds a storage volume of two pages, then a first portion of the data is signalled via channel 150 to page buffer 160, wherein the data portion has the size of two pages and accordingly is stored in page buffer 160 of flash device 110. Immediately after the operation of buffering the first data portion in page buffer 160 the flash device is controlled to program the data portion, i.e., to copy, from page buffer 160 to two flash memory pages, wherein the flash memory pages are arranged in first and second plane 140 and 141 respectively, such that the flash memory pages can be programmed at the same time. The two flash pages, for example, may be those comprising sectors 0 to 7, such that the first data portion is stored in flash memory pages marked 0 and 4 in the drawing.

The operation of channel 150 and flash device 110 does not affect channel 151 and any of the flash devices coupled thereto. Accordingly a second portion of the data can be signalled via channel 151 to flash device 111 at the same time when signalling the first data portion to flash device 110. Similar as described above for flash device 110 the data portion is buffered in page buffer 161 of flash device 111 and is then programmed to pages of flash memory as soon as the operation of buffering of the data portion in buffer 161 is completed. The second data portion of the file to be stored thus is stored in flash pages of a different memory management block in a different flash device. For example, the second data portion may be stored in flash memory pages marked 8 and 12 in flash device 111.

The programming of the first data portion from page buffer 160 to pages of flash memory is a process being internal to flash device 110 and does not affect the operation of channel 150. Channel 150 accordingly may be used again to transmit data as soon as the signalling of the first data portion to buffer 160 is completed. A third data portion of the file thus can be signalled to page buffer 162 located in flash device 112 immediately after completing the signalling of the first portion, i.e., while the contents of page buffer 160 is programmed to flash memory pages in flash device 110. Again as soon as the signalling of the third data portion to page buffer 162 has been completed the data may be programmed to flash memory pages in flash device 112, for example, those marked as 16 and 20.

Similarly as described for the third data portion a fourth data portion can be signalled via channel 151 to a coupled flash device at the same time when signalling the third data portion via channel 150, such that the fourth data portion, for example, can be stored in flash memory pages marked 24 and 28 of flash device 113.

Further on, i.e., as soon as the transfer of the third and fourth data portion via channels 150 and 151 respectively to page buffers 162 and 163 is completed, more data portions of the file can be signalled to flash devices coupled to a channel for storing the data portions in the respective flash devices.

Each channel in this way may signal a data portion to a coupled flash device while at the same time another of the coupled flash devices is busy with programming data signalled previously to the other coupled flash device. So each channel can be used to seamlessly signal data portions to be stored to coupled flash devices thus fully utilizing the signalling capacity of the channel.

As a result of the above described procedure the file to be stored in the flash drive is split into data portions having the size of a page buffer in a flash device. The data portions may be distributed across a plurality of memory management blocks located in a plurality of flash devices, which may be coupled to a plurality of channels. Also the memory blocks comprising the flash memory pages storing the data portions of the file may be located anywhere in a flash device, i.e., they can be but are not necessarily in a sequential order within a flash device.

Using a plurality of channels for signalling the portions of one file at the same time and wherein the data portions are distributed across the channels and across a plurality of flash devices coupled to a channel allows storage of the data portions such that they may be read in the correct order using the plurality of channels.

Figure 2:
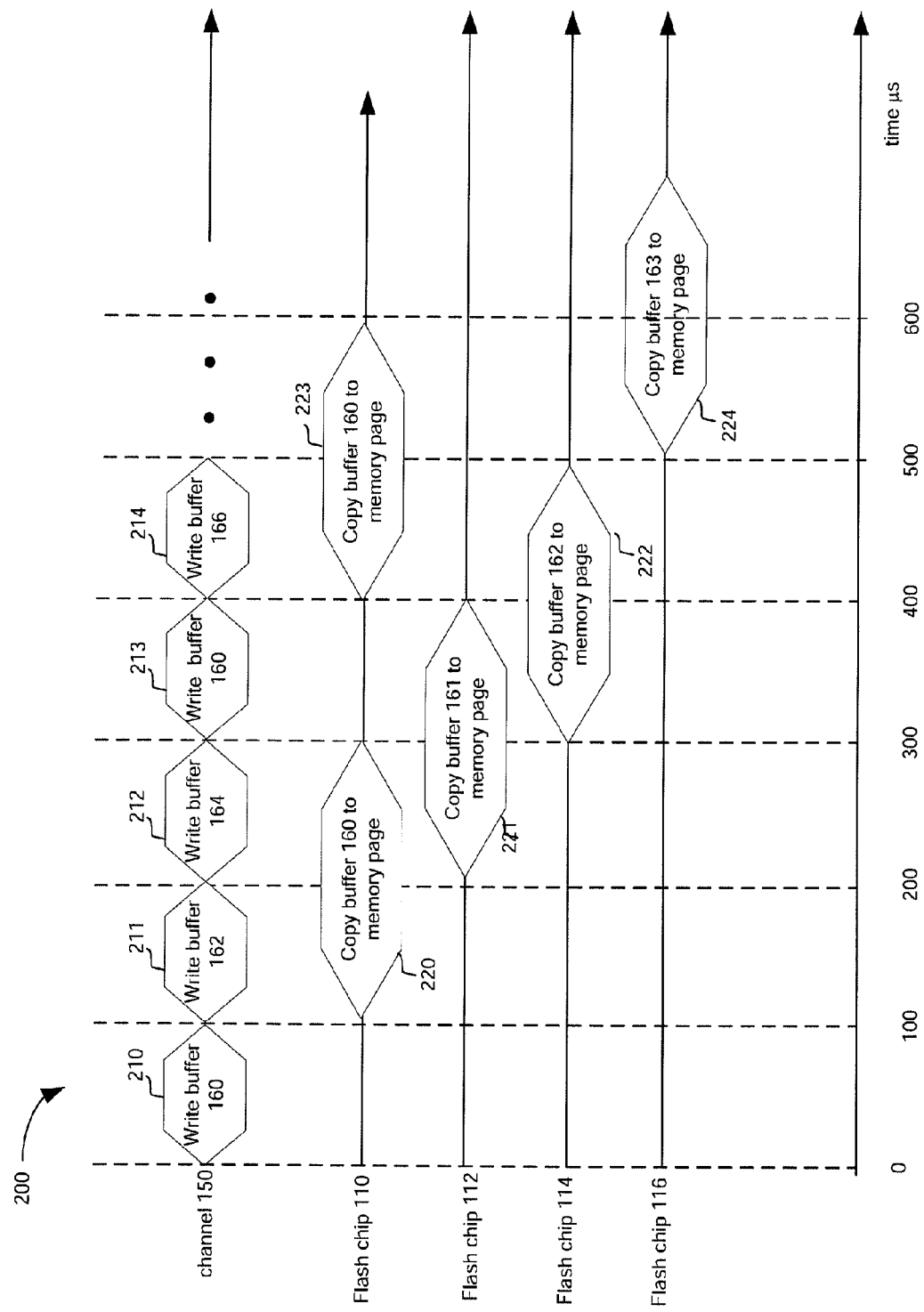
FIG. 2 depicts a timing diagram illustrating the processing and sequence of write accesses.

FIG. 2 depicts a schematic timing diagram 200 of the operation of channel 150 and of flash devices 110, 112, 114 and 116 coupled to the channel, wherein the operation of channel 150 is representative for any of the channels in the flash drive. It is assumed that at t=0 flash device 110 is ready for receiving data in page buffer 160. Starting at t=0 the first data portion is signalled to flash device 110. Data of the size of two pages is thus buffered in page buffer 160, wherein the operation 210 of writing the data to page buffer 160 lasts 100 µs, such that in the time interval t=0 to t=100 µs the channel is busy with signalling a first data portion to page buffer 160 as indicated by 210. Upon completion, i.e., at t=100 µs, flash device 110 is controlled to start programming 220, i.e., copying, a first chunk of the data from page buffer 160 to one flash memory page in plane 140 of memory management block 130 and at the same time a second chunk of the data to a page in plane 141, thus programming the flash memory pages in the two planes of block 130 at the same time. The process of programming the pages, i.e., copying the contents from page buffer 160 to the flash memory pages, lasts 200 µs, such that the programming 220 of the contents of page buffer 160 lasts from t=100 µs to t=300 µs.

At the same time while the contents of page buffer 160 is programmed to flash memory pages, i.e., starting at t=100 µs, channel 150 signals in write operation 211 the third data portion to page buffer 162 of flash device 112 lasting from t=100 µs to t=200 µs. Upon completion of this signalling operation flash device 112 is controlled to start copying the contents of buffer 162 to a flash page in a first plane and at the same time to a flash page in the second plane in flash device 112, which will last from t=200 µs to t=400 µs.

At t=200 channel 150 starts write operation 212 for writing a fifth data portion to page buffer 164 in flash device 114, wherein operation 212 lasts until t=300 µs. Similarly, as described above, flash device 114 is controlled to start copy operation 222 for copying the contents of buffer 164 to two flash memory pages upon completion of write operation 212, i.e., at t=300 µs.

Also at t=300 µs copy operation 220 has ended. As the contents of page buffer 160 has been programmed to flash memory pages it may be deleted or overwritten by other data. That is page buffer 160 is ready for receiving another data portion. Accordingly channel 150 may start write operation 213 to write a seventh data portion to page buffer 160 in flash device 110. As soon as write operation 213 comes to an end flash device 110 is controlled to start data copy operation 223 for programming the seventh data portion from page buffer 160 to flash memory pages in flash device 110.

Data to be stored in flash memory may thus be signalled to a page buffer in a flash device as soon as its contents has been programmed to flash memory pages within the flash device. Accordingly the page buffers in the three flash devices coupled to channel 150 allow to signal data seamlessly over one channel. Channel 150 thus signals data to the coupled flash devices seamlessly, such that the channel may transmit data without having to wait for flash devices to get ready for receiving data. That is in this way the limiting factor of data transmission using one channel is the speed of writing to a page buffer, but not the speed of programming any data to a page of flash memory.

Generally a channel may freely use any of its coupled flash devices being ready at a time for signalling data to. That is the channel may deliberately jump to any flash device being ready to receive data in its page buffer. For example, at t=400 µs copy operation 221 is completed such that another data portion can be signalled to page buffer 162 in flash device 112 or page buffer 164 in flash device 114. Here the data portion is signalled in write operation 214 to page buffer 166 in order to distribute data evenly across all coupled flash devices, thus averaging the use of each flash device and each flash page.

In this embodiment there are at least three flash devices coupled to one channel, such that there is at least one page buffer in a flash device ready for receiving a data portion from the channel. It is apparent that depending on the time needed for programming the contents of the page buffer to flash memory pages more flash devices need to be coupled to a channel to provide for seamless operation of the channel.

The overall speed of a memory device comprising more than one channel, wherein each channel can be operated independently, can be calculated by multiplying the number of channels with each specific channel speed. The overall speed of a flash drive thus can be increased by employing a plurality of independent channels, wherein each channel is coupled to a plurality of flash devices.

Figure 3:
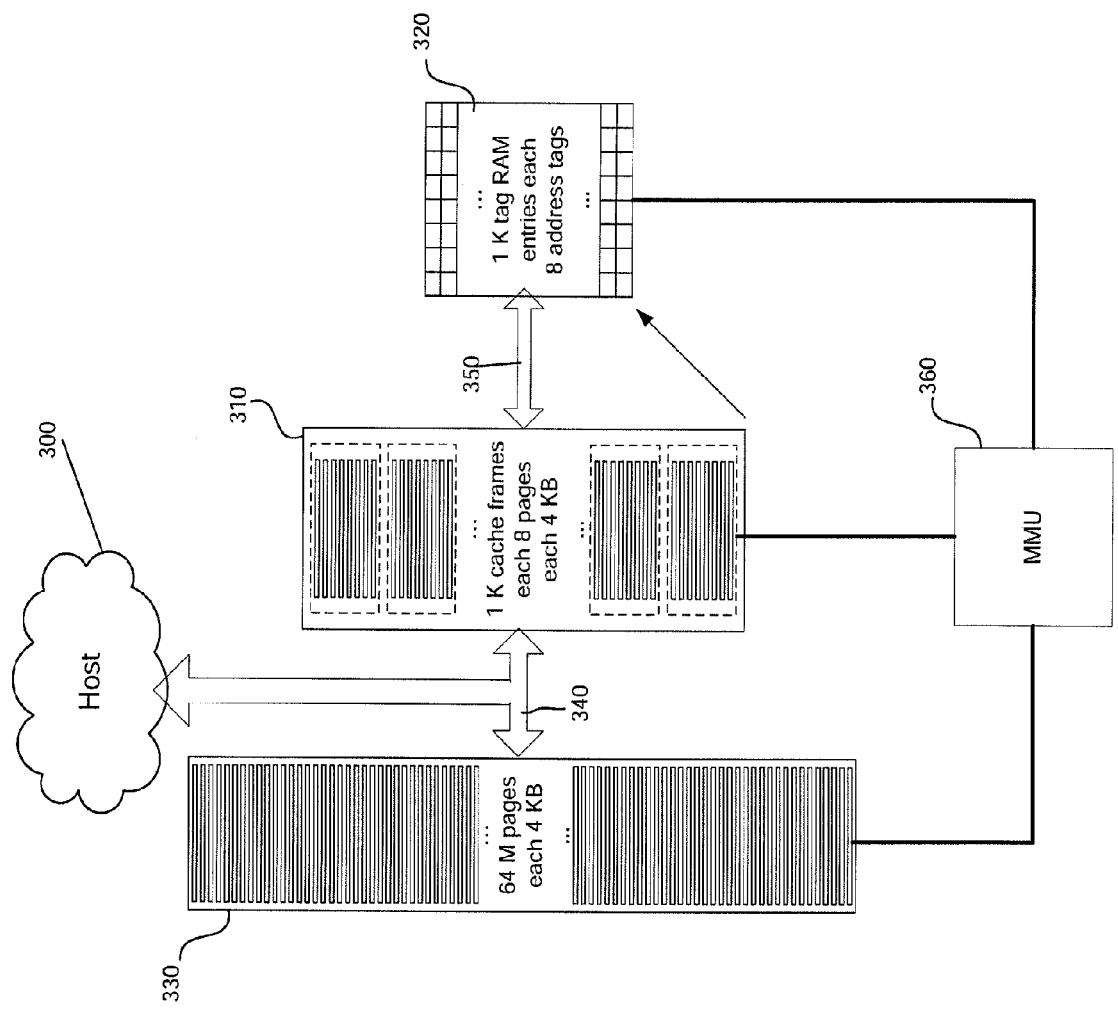
FIG. 3 depicts a block schematic of a memory device structure.

FIG. 3 schematically depicts a flash drive coupled to a host 300, wherein the host can be any digital processing system using the flash drive for storing data.

The flash drive couples via bus 340 to the host and comprises a cache memory 310, flash memory 330, tag memory 320 and a memory management unit 360 controlling the operation of the sub-circuits. Note that although drawn as separate blocks the cache memory 310, flash memory 330, tag memory 320 and the memory management unit 360 (MMU) may be integrated in one chip, such that these functional blocks are part of an integrated circuit (IC). Alternatively any of these functional blocks may be implemented on a standalone IC or may be grouped with other functional blocks. In one embodiment all functional groups forming a controller for flash memory may be grouped and implemented in one IC thus forming a controller IC for controlling a flash memory IC.

Cache memory 310 is of any fast memory type, for example, of volatile SRAM or DRAM, in order to allow fast operations. Cache 310 may have 1 k (1 k=1024) frames with each frame organized to 8 pages, wherein each page has a storage capacity of 4 kB, such that each page in the cache memory may store the contents of two flash memory pages, i.e., the storage size of a cache line matches the storage size of two flash memory pages.

In one embodiment cache memory 310 is organized as N-way set-associative, i.e., in one particular example the cache memory is an 8-way set associative memory. Accordingly the contents of a page of flash memory 330 may be cached as a copy in one of eight admissible storage locations within cache memory 310. Note that in other embodiments cache memory 310 may be organized differently, for example, as 4-way set associative.

Also tag memory 320 is of any fast memory type, for example, of volatile SRAM, in order to allow operations as fast as operations to cache memory 310. Preferably tag memory 320 is of the same memory type as cache memory 310. The storage size of tag memory 320 is designed such that the tags for the pages stored in cache memory 310 can be stored in tag memory 320. So for each page of data a tag is stored in tag memory 320, wherein a tag of a data page may comprise an address tag and valid, dirty and age information and/or a tag indicating the relevance of the data page. Tag memory 320 may thus provide storage capacity for the 1 k cache frames of cache memory 310, i.e., 1 k tag entries each having storage capacity for 8 tags. Tag memory 320 is coupled via bus system 350 to cache memory 310 and is further coupled to memory management unit 360 for control information.

Flash memory 330 is the memory for finally storing the data and, for example, may comprise 64M (M=mega=$2^{20}$) pages of non-volatile flash memory, each page having a storage capacity of 2 kB, such that flash memory 330 in total has a storage capacity of 128 GB. The flash memory cells are organized as described above in FIG. 1 and the flash devices are operatively coupled to flash memory 330 via channels 150, 151.

Flash memory 330 is operatively coupled to cache memory 310 via bus 340. Bus 340 accordingly at least comprises one channel 150, which in turn is coupled to flash devices as described with reference to FIG. 1. Note that bus 340 may also comprise other entities for coupling to host 300, i.e., bus 340 may comprise a channel 150 for coupling flash memory 330 to cache memory 310 and may comprise another physical entity for signalling data to and from host 300.

The interaction between cache memory 310, tag memory 320 and flash memory 330 is controlled by a memory management unit 360, which accordingly controls the processing of read and write actions in the flash drive as requested by host 300.

For reading data from flash drive host 300 signals a corresponding read request to flash drive via bus 340. Accordingly the drive reads the requested data and forwards the requested data via bus 340 to the host 300. In case the requested data is buffered in cache memory 310 the cache memory is accessed and the requested data is read from cache memory 310 and signalled via bus 340 to the host. That is for each read request received from host 300 the flash drive checks if the requested data is buffered, i.e., stored as a copy, in cache memory 310. In case the requested data cannot be found in the cache memory the data is read from flash memory 330 and is forwarded via bus 340 to the requesting host. The data requested in a read request may not be buffered in cache memory 310, as it may be unlikely that the same data will be requested again soon.

When storing data in the flash drive the host transmits the data via bus 340. In case the data to be stored in the flash drive is a large file, i.e., the write action is a sequential write, the flash drive is aware of the action being a sequential write, then the data may be stored directly in flash memory 330 without being buffered in the cache memory. However there may be situations in which there is no indication for the flash drive whether the write action is a sequential write of a large file or not.

As most of the write operations are random access write operations, i.e., write operations in which data to be written is not sequential organized but randomly spread, the data is buffered, i.e., stored in cache memory 310. So whenever a page of data is updated again, i.e., accessed in another write action, the page is updated in the cache memory 310 without immediately updating the corresponding data in flash memory 330. However as the size of cache memory 310 does not allow to keep a copy of each page of flash memory 330, but only some of the pages, only the most reasonable pages may be kept as a copy in cache memory. Accordingly tag memory 320 comprises an entry reflecting which data of flash memory 330 actually is stored as copy in cache memory 310.

Taking into account that with high probability those pages that have been accessed at last will be accessed in the near future only the last recently used (LRU) pages may be cached in the cache memory. This can be achieved by implementing the LRU paging algorithm. In one embodiment a serial number may be assigned to a page and kept in the corresponding tag of the cached page such that smaller number indicate older pages. Accordingly when a frame runs out of free memory pages, i.e., for example, 6 out of the 8 pages of a frame are occupied by frames, then older pages, i.e., those having smaller numbers, are copied back to flash memory 330 thus freeing pages in cache memory 310. Frequently accessed and cached pages, which are assigned a new serial number to indicate their relevance, are comparatively rarely copied back to flash memory 330.

One effect of caching frequently updated pages is the increase in throughput of write operations as the pages can be updated faster in the cache memory. Accordingly the throughput in particular for random access write operations can be increased thus increasing the overall performance of the flash drive.

Also the number of write operations in flash memory 330 is reduced as frequently accessed pages may be updated in cache memory more than once before they are copied back to flash memory. Accordingly the total number of write operations and in particular of copy and merge operations in the flash memory is reduced. Each flash memory cell is written less frequently thus increasing its lifetime and the overall performance of the drive is improved due to fewer copy and merge operations.

Furthermore a flash drive in one embodiment is configured and adapted to uniformly distribute the pages to those written across all coupled flash devices. Also the flash devices may be configured and adapted to uniformly distribute write operations across the flash memory pages within a flash device, such that all flash memory cells in a flash device are used equally frequent. In this way the wearing down is uniformly distributed across the memory cells thus increasing the overall lifetime of the flash device.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiments disclosed.

What is claimed is:

1. A system comprising:
 a first plurality of flash devices, each first flash device comprising a plurality of flash memory planes, the flash memory planes comprising flash memory pages, each first flash device further comprising a first buffer configured to buffer data to be transmitted to and from the first flash device, wherein the first buffer comprises a storage size of at least two flash memory pages including their meta data, wherein the first buffer comprises a volatile memory and the flash memory page comprises a non-volatile memory;
 a second plurality of flash devices, each second flash device comprising a plurality of flash memory planes, the flash memory planes comprising flash memory pages, each second flash device further comprising a second buffer configured to buffer data to be transmitted to and from the second flash device, wherein the second buffer comprises a storage size of at least two flash memory pages including their meta data;
 a cache memory configured to buffer data of the flash devices;
 a tag memory coupled to the cache memory through a bus system, wherein the tag memory is configured to store a tag for each page of data buffered in the cache memory, wherein the tag for each page of data buffered in the cache memory comprises validity and age information;
 a first channel connected to the first plurality of flash devices, the first channel configured to transmit data between the first plurality of flash devices and the cache memory; and
 a second channel connected to the second plurality of flash devices, the second channel configured to transmit data between the second plurality of flash devices and the cache memory.

2. The system of claim 1, wherein the cache memory comprises volatile memory type.

3. The system of claim 1, wherein the system is configured to transmit data to one of the first flash devices while at the same time another of the first flash devices coupled to the first channel programs previously transmitted data to flash memory pages, and wherein the system is further configured to transmit data to one of the second flash devices while at the same time another of the second flash devices coupled to the second channel programs previously transmitted data to flash memory pages.

4. The system of claim 1, wherein the storage size of the first buffer consists essentially of a first page of a first memory plane in the first flash device and a second page of a second memory plane in the first flash device, and wherein the storage size of the second buffer consists essentially of a third page of a first plane in the second flash device and a second page of a fourth memory plane in the second flash device.

5. The system of claim 1, wherein the first to fourth pages comprise the same storage size.

6. The system of claim 1, wherein the buffer comprises volatile memory.

7. The system of claim 1, wherein the tag memory is as fast as the cache memory.

8. The system of claim 1, wherein the cache memory comprises a storage size of at least two flash memory pages including their meta data.

9. The system of claim 1, wherein the tag memory comprises an entry reflecting which data stored in the flash devices is actually stored as a copy in the cache memory.

10. The system of claim 1, wherein the cache memory is configured to store only the last recently used page stored in the flash devices.

11. A method for operating a flash memory drive comprising:
 caching the received data in a cache memory;
 in a tag memory coupled to the cache memory through a bus system, storing a tag for each page of data cached in the cache memory, wherein the tag for each page of data buffered in the cache memory comprises validity and age information;
 sequentially signalling data portions via a first channel from the cache memory to two or more flash devices coupled to the cache memory, wherein each flash device comprises a page buffer;
 at the same time as data portions are signalled via the first channel, sequentially signalling data portions via a second channel from the cache memory to two or more flash devices;
 after signalling a first data portion via the first channel to a first page buffer of a first flash device, signalling a second data portion via the first channel to a second page buffer of a second flash device and at the same time signalling the first data portion from the first page buffer to a flash memory page of the first flash device, wherein the first page buffer comprises a volatile memory and the flash memory page of the first flash device comprises a non-volatile memory; and after signalling a third data portion via the second channel to a third page buffer of a third flash device, signalling a fourth data portion via the second channel to a fourth page buffer of a fourth flash device and at the same time signalling the third data portion from the third page buffer to a flash memory page of the third flash device.

12. The method according to claim 11, wherein the cache memory is organized as an N-way associative cache, N being an integer.

13. The method according to claim 11, wherein the flash memory page of the first flash device is a flash memory page in one of a plurality of planes of the first flash device.

14. The method according to claim 13, wherein the flash memory page of the third flash device is a flash memory page in one of a plurality of planes of the third flash device.

15. The method according to claim 11, wherein signalling the first data portion from the first page buffer to the flash memory page of the first flash device comprises signalling the first data portion from the first page buffer to a first flash memory page in a first plane of the first flash device and to a second flash memory page in a second plane of the first flash memory device.

16. The method according to claim 15, wherein signalling the third data portion from the third page buffer to the flash memory page of the third flash device comprises signalling the first data portion from the third page buffer to a first flash memory page in a first plane of the third flash device and to a second flash memory page in a second plane of the third flash memory device.

17. The method according to claim 11, further comprising after signalling the second data portion via the first channel to a first page buffer of a first flash device, signalling a fifth data portion via the first channel to a fifth page buffer of a fifth flash device and at the same time signalling the second data portion from the second page buffer to a flash memory page of the first flash device.

18. The method according to claim 17, further comprising after signalling the fourth data portion via the second channel to a fourth page buffer of a fourth flash device, signalling a sixth data portion via the second channel to a sixth page buffer of a sixth flash device and at the same time signalling the fourth data portion from the fourth page buffer to a flash memory page of the fourth flash device.

19. A system comprising:

a first plurality of flash devices, each first flash device comprising a plurality of flash memory planes, the flash memory planes comprising flash memory pages, each first flash device further comprising a first buffer configured to buffer data to be transmitted to and from the first flash device, wherein the first buffer comprises a storage size of at least two flash memory pages including their meta data, wherein the first buffer comprises a volatile memory and the flash memory page comprises a non-volatile memory;

a cache memory coupled to the first plurality of flash devices through a first bus system, wherein the cache memory is configured to buffer data of the first plurality of flash devices, wherein the first bus system comprises a first channel connected to the first plurality of flash devices, the first channel configured to transmit data between the first plurality of flash devices and the cache memory; and a tag memory coupled to the cache memory through a second bus system, wherein the tag memory is configured to store a tag for each page of data buffered in the cache memory, wherein the tag for each page of data buffered in the cache memory comprises validity and age information, and wherein the tag memory comprises an entry reflecting which data stored in the first flash device is actually stored as a copy in the cache memory.

20. The system of claim 19, wherein the cache memory is configured to store only the last recently used page stored in the first flash device.

21. The system of claim 19, further comprising:

a second plurality of flash devices, each second flash device comprising a plurality of flash memory planes, the flash memory planes comprising flash memory pages, each second flash device further comprising a second buffer configured to buffer data to be transmitted to and from the second flash device, wherein the cache memory is coupled to the first plurality of flash devices through the first bus system, and wherein the second buffer comprises a storage size of at least two flash memory pages including their meta data, wherein the first bus system comprises a second channel connected to the second plurality of flash devices, the second channel configured to transmit data between the second plurality of flash devices and the cache memory.

* * * * *